United States Patent
Wu (10) Patent No.: US 6,235,566 B1
(45) Date of Patent: May 22, 2001

(54) TWO-STEP SILICIDATION PROCESS FOR FABRICATING A SEMICONDUCTOR DEVICE

(75) Inventor: Bing-Chang Wu, Shu-Lin Chen (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/472,131

(22) Filed: Dec. 23, 1999

(51) Int. Cl.⁷ ................................. H01L 21/8238
(52) U.S. Cl. ............ 438/199; 438/197; 438/199; 438/649; 438/652; 438/655; 257/369
(58) Field of Search .................. 438/199, 197, 438/649, 652, 655; 257/369

(56) References Cited

U.S. PATENT DOCUMENTS

| | | | |
|---|---|---|---|
| 5,130,266 | * 7/1992 | Huang et al. .................. | 437/44 |
| 5,723,893 | * 3/1998 | Yu et al. ........................ | 257/413 |
| 5,793,089 | * 8/1999 | Fulford, Jr. et al. .......... | 257/408 |
| 5,933,741 | * 8/1999 | Tseng ............................ | 438/305 |
| 5,943,581 | * 8/1999 | Lu et al. ........................ | 438/386 |
| 6,015,746 | * 1/2000 | Yeh et al. ...................... | 438/421 |
| 6,107,131 | * 8/2000 | Huang .......................... | 438/238 |

* cited by examiner

Primary Examiner—Matthew Smith
Assistant Examiner—Granvill Lee (57) ABSTRACT

A two-step silicidation process for fabricating a semiconductor device is disclosed. The method includes the following steps. Firstly, two trench isolation regions are formed in a semiconductor substrate. A gate oxide layer and a polysilicon layer and a barrier layer are formed. Patterning is carried out to etch portions of the barrier layer. The areas between the trench isolation regions and the gate region are respectively used as a source area and a drain area. First ions are implanted into the substrate. A dielectric layer is blanket formed and the dielectric layer is etched back to form dielectric spacer. The second ions are implanted into the substrate. The first silicide regions respectively are formed in the source area and the drain area. A poly-metal dielectric (PMD) layer is formed and is etched back. Finally, the second silicide region is formed on and in the polysilicon layer.

9 Claims, 7 Drawing Sheets

TWO-STEP SILICIDATION PROCESS FOR FABRICATING A SEMICONDUCTOR DEVICE

BACKGROUND OF THE INVENTION

1. Field of the Invention

The invention relates to optimize source/drain and gate with low resistance, more particularly by using silicide technology to optimize performance of source/drain and gate.

2. Description of the Prior Art

As the time being, integration of integrated circuit, semiconductor device is gradually increased greatly than before. Size of semiconductor device is shorter and shorter than before as well. Therefore, it is important that keeping good operation condition even though the size of semiconductor is measured as small as angstroms. Particularly preferring conventional complementary metal-oxide semiconductor (C.M.O.S.) device, usually used as high-voltage device, is seriously mentioned. Generally the conventional horizontal-direction C.M.O.S. structure will occupy much of space of chip due to it is a widely deposition device. Also, the channel and drift area of conventional C.M.O.S. will occupy horizontal-direction space of chip. Therefore, if possible, it is necessary to be modified geometry of C.M.O.S. device.

Secondly, as the C.M.O.S. channel becomes shorter, the electric field along the channel becomes stronger (for a given power supply voltage). That is, the potential distribution becomes two dimensional, and the effect of the electric field along the channel can no longer be ignored while considering the effects of the electric field normal to the channel.

The conventional art is shown as FIG. 1A to FIG. 1E. From the cross sectional diagram of FIG. 1A, substrate 10, shallow trench isolation 11, N-well and P-well 12 are all provided.

Figure 1A:
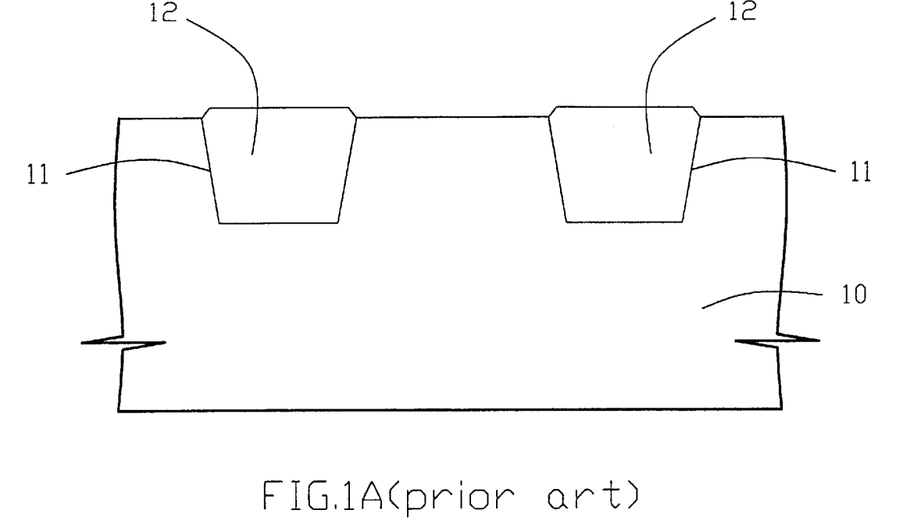
FIGS. 1A to 1E are cross sectional diagrams schematically illustrating the prior art.
Figure 1B:
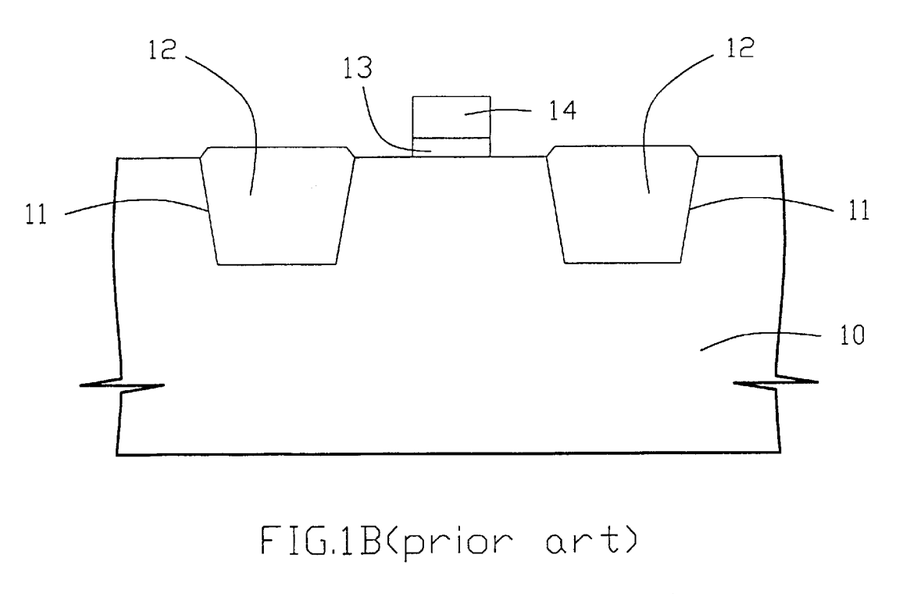

Then, as FIG. 1B, gate oxide 13 is grown up and polysilicon gate 14 is formed by the conventional deposition.

Figure 1C:
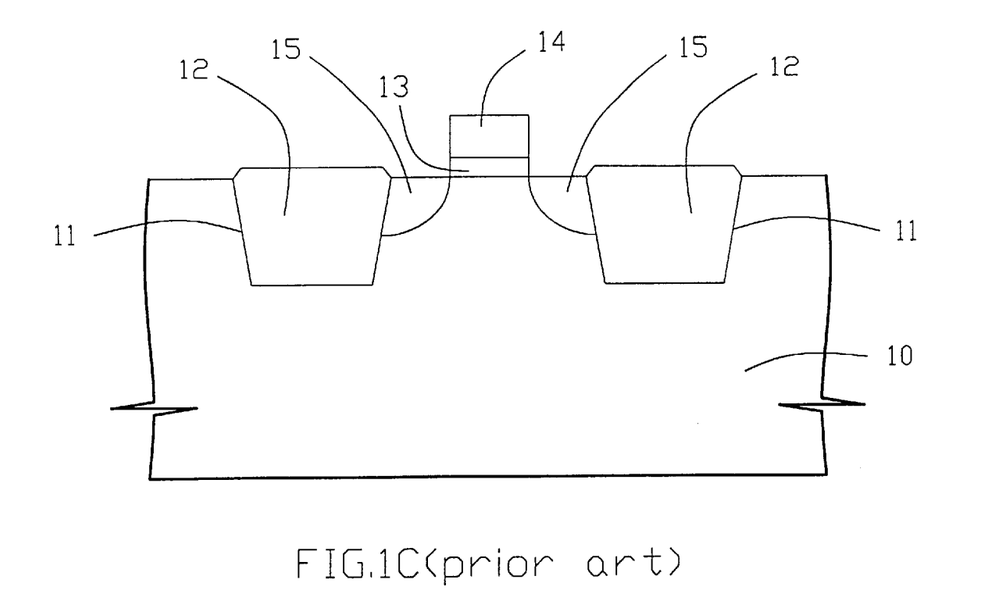

Sequentially, LDD implants can be carried out as source/drain region 15 as FIG. 1C.

Figure 1D:
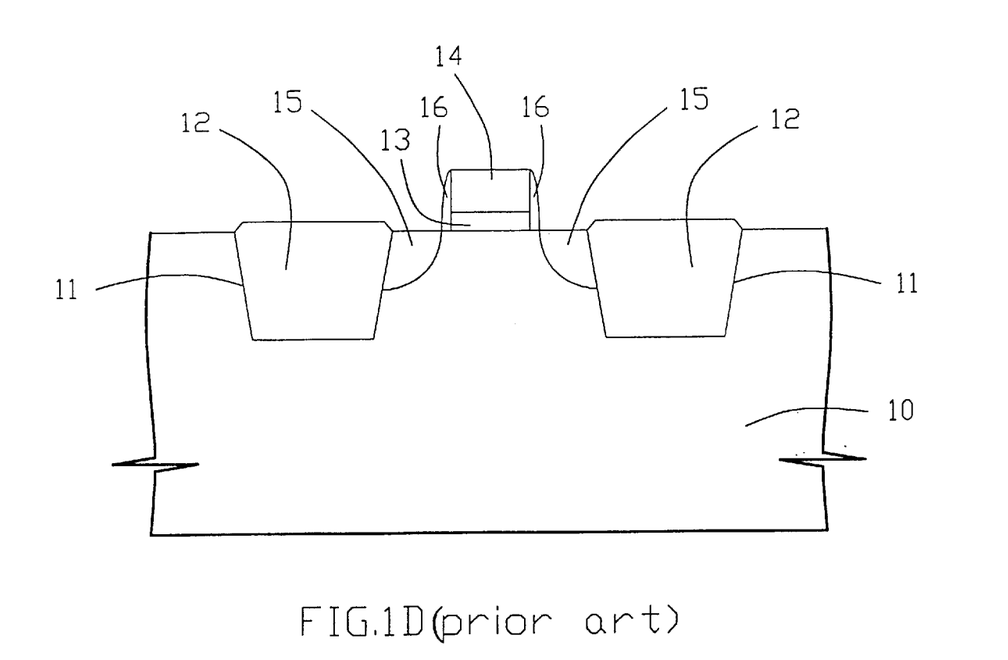

For spacer 16 formation, it is shown as FIG. 1D. Again, referring with FIG. 1D, N+ and P+ well region 15 all will be formed by implanting. Next, source/drain are all annealed as indicated FIG. 1D.

Figure 1E:
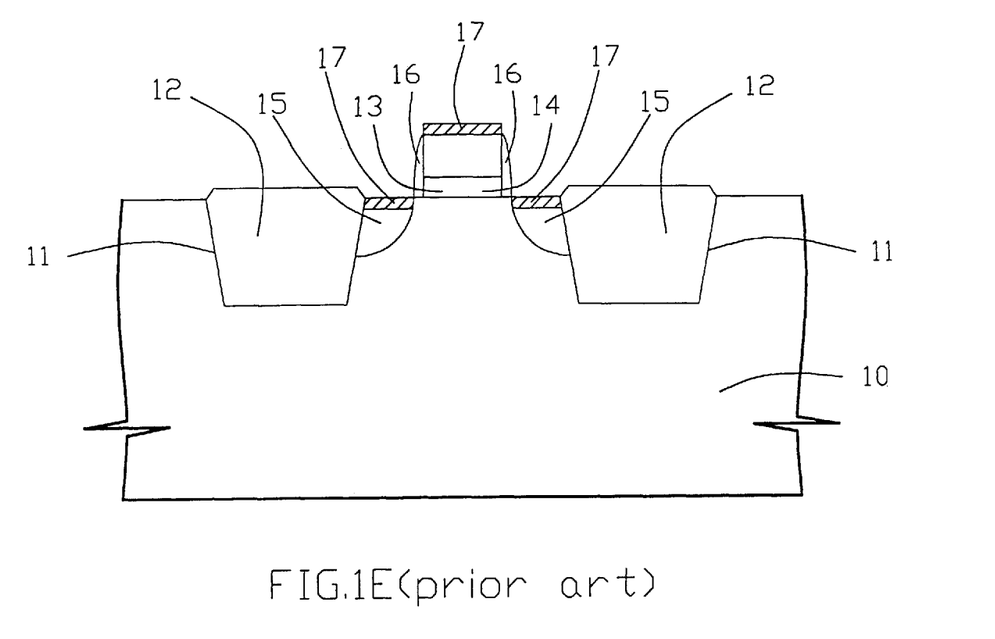

Finally, FIG. 1E shows that sacilide 17 can be formed at the same time on source/drain region 15 and on top surface of polysilicon gate 14.

As semiconductor device is gradually scaled down, for lower junction leakage of ultra-shallow junction source/drain, thickness in silicide should be reduced. Thus, the scale of silicide on polysilicon gate is also reduced. This will make sheet resistance increase very much in the practical. Therefore, the above problem should be involved in the semiconductor process. It is necessary to widely employ the silicide process for the ultra large semiconductor integrated (ULSI) process.

SUMMARY OF THE INVENTION

In accordance with the present invention, a method is provided for optimizing source/drain and polysilicon gate that substantially using a novel silicide process.

The advantages according to the preferred embodiment will be described as the following. There is no source/drain and polysilicon gate bridging due to the wider production window exists. Sheet resistance of polysilicon gate can be suppressed completely. Sheet resistance of source/drain can be optimized for the sub-0.25 um flow in new generation. And, titanium silicide process can be used under sub-0.25 um semiconductor device in new generation.

In the preferred embodiment, firstly, two trench isolation regions are formed in a semiconductor substrate. The isolation regions are separated from each other by an active region. A gate oxide layer is formed on the substrate. A polysilicon layer is formed on the gate oxide layer. A barrier layer is formed on the polysilicon layer. Patterning is carried out to etch portions of the barrier layer. Then the polysilicon layer and the gate oxide layer until the substrate is exposed, thereby forming a gate region substantially located in the midway between the trench isolation regions. The areas between the trench isolation regions and the gate region are respectively used as a source area and a drain area. First ions are implanted into the substrate using the gate region and the trench isolation regions as an implant mask. A dielectric layer is blanket formed over the gate region and the substrate. The dielectric layer is etched back to form dielectric spacer on sidewalls of the gate region. The second ions are implanted into the substrate using the gate region. The dielectric spacer and the trench isolation regions are used as an implant mask. The conductivity type of the first ions are the same as conductivity type of the second ions, and the concentration of the second ions are greater than the concentration of the first ions. The first silicide regions respectively are formed in the source area and the drain area by thermally reacting first metal and the substrate in the source and the drain area. The gate region is prevented from being reacted with the first metal by the protection of the barrier layer and the dielectric spacer. A poly-metal dielectric (PMD) layer is formed over the substrate and the gate region. The poly-metal dielectric layer is etched back and the barrier layer until the surface of the polysilicon layer is exposed. The second silicide region is formed on and in the polysilicon layer by thermally reacting second metal and the polysilicon layer. The source and the drain regions are prevented from further reacting by the protection of the poly-metal dielectric layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed.

Moreover, while the present invention is illustrated by a number of preferred embodiments directed to semiconductor device, it is not intended that these illustrations be a limitation on the scope or applicability of the present invention. Thus, it is not intended that the semiconductor devices of the present invention be limited to the structures illustrated. These devices are included to demonstrate the utility and application of the present invention to presently preferred embodiments.

Figure 2A:
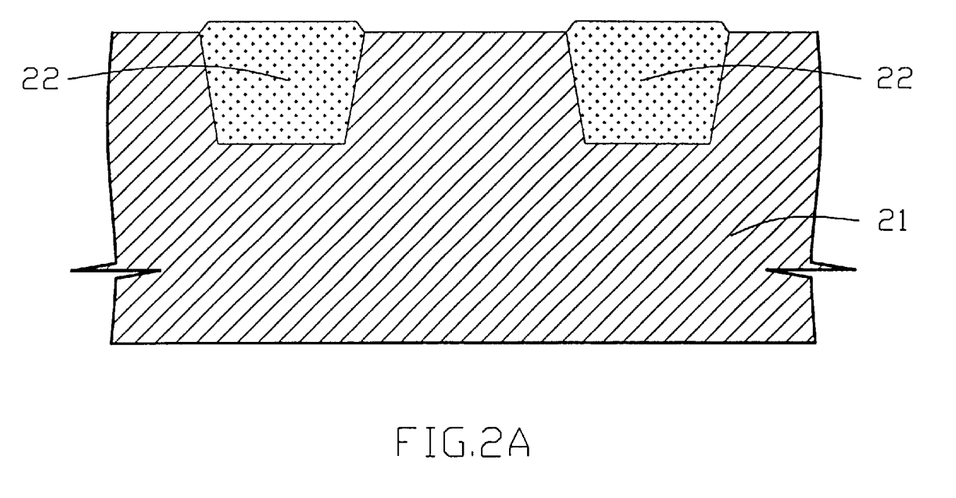
FIGS. 2A to 2G are cross sectional diagrams schematically illustrating an embodiment of the invention.

The spirit of the proposed invention can be explained and understood by the following embodiments with corresponding figures. it will briefly be noted here that substrate 21 is provided in FIG. 2A. two trench isolation regions 22 are formed in semiconductor substrate 21. Especially, isolation regions 22 are separated from each other by an active region.

Figure 2B:
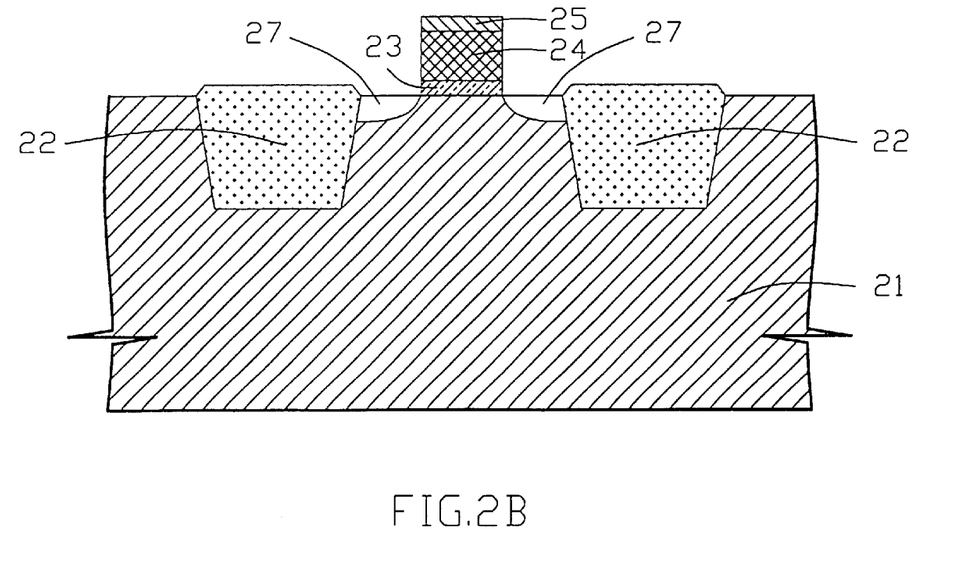

It is shown as FIG. 2B, gate oxide layer 23 is formed on substrate 21. Polysilicon layer 24 is formed on gate oxide layer 23. Barrier layer 25 is formed on polysilicon layer 24.

Still referring with FIG. 2B shows that patterning is carried out to etch portions of barrier layer 25. The material for this barrier layer 25 is selected from silicon oxide. And the thickness of this barrier layer 25 is mostly preferred 100 to 700 angstroms. Then, polysilicon layer 24 and gate oxide layer 23 until substrate 21 is exposed, thereby forming a gate region substantially located in the midway between trench isolation regions 22. The areas between trench isolation regions 22 and the gate region are respectively used as a source area 27 and a drain area 27. First ions are implanted into substrate 21 using the gate region and trench isolation regions 22 as an implant mask.

Figure 2C:
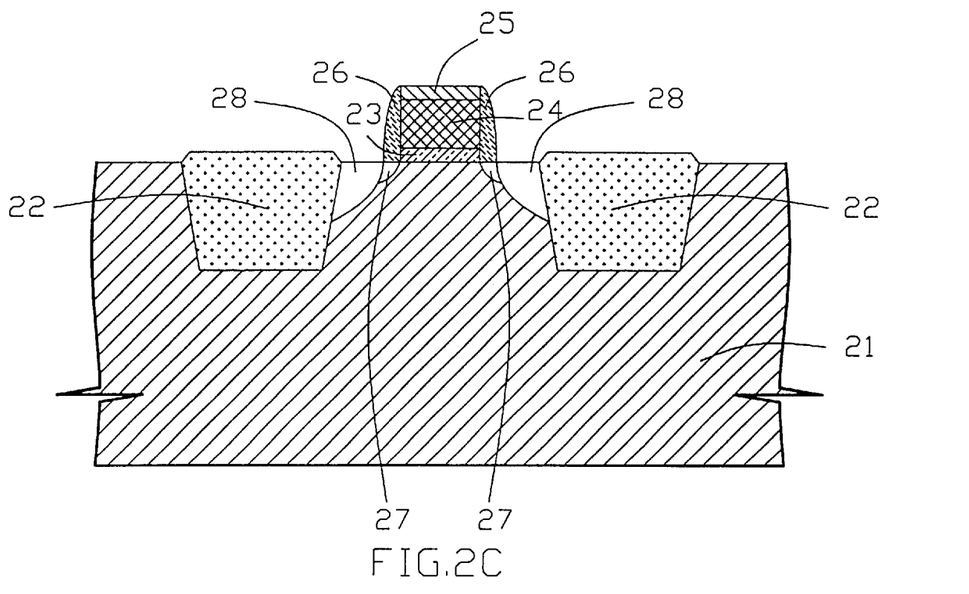

As FIG. 2C, dielectric layer is blanket formed over the gate region and substrate 21. Normally, dielectric layer is silicon oxide. Then, dielectric layer is etched back to form dielectric spacer 26 on sidewalls of the gate region. The second ions are implanted into substrate 21 using the gate region to form a source/drain region 28. The dielectric spacer 26 and trench isolation regions 22 are used as an implant mask. The conductivity type of the first ions is the same as conductivity type of the second ions, and the concentration of the second ions is greater than the concentration of the first ions.

Figure 2D:
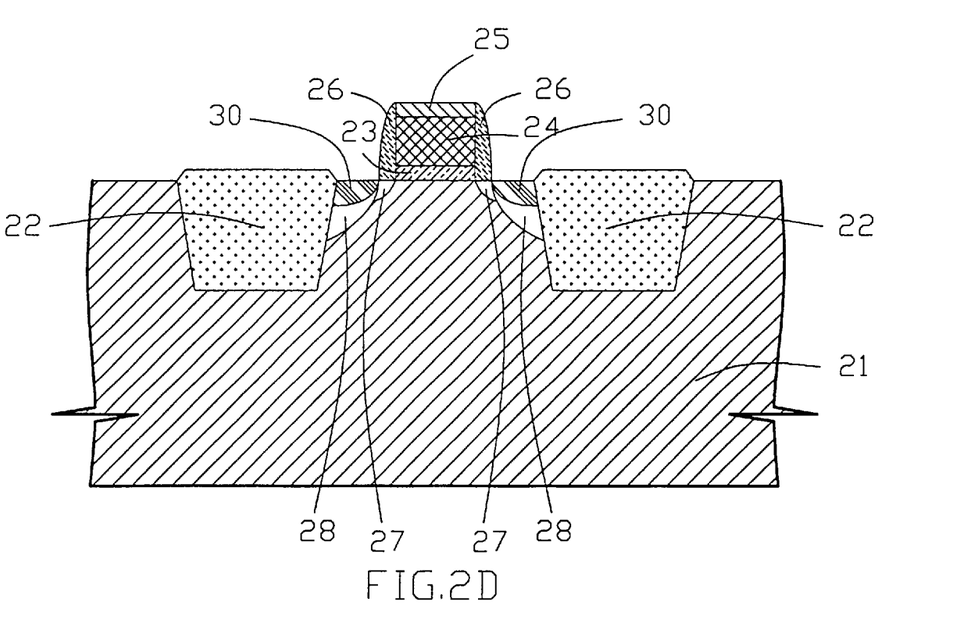

As FIG. 2D, first silicide regions 30 respectively are formed in the source area and the drain area by thermally reacting first metal and substrate 21 in the source and the drain area. The above first metal is metal titanium. Also, the thickness of this first silicide regions 30 is mostly preferred 200 to 600 angstroms. The gate region is prevented from being reacted with the first metal by the protection of the barrier layer 25 and dielectric spacer 26.

Figure 2E:
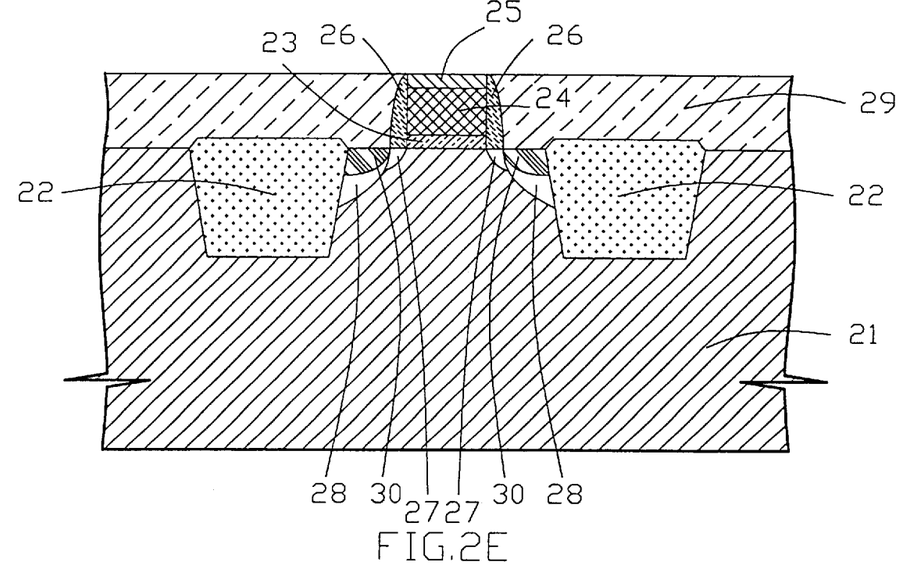
Figure 2F:
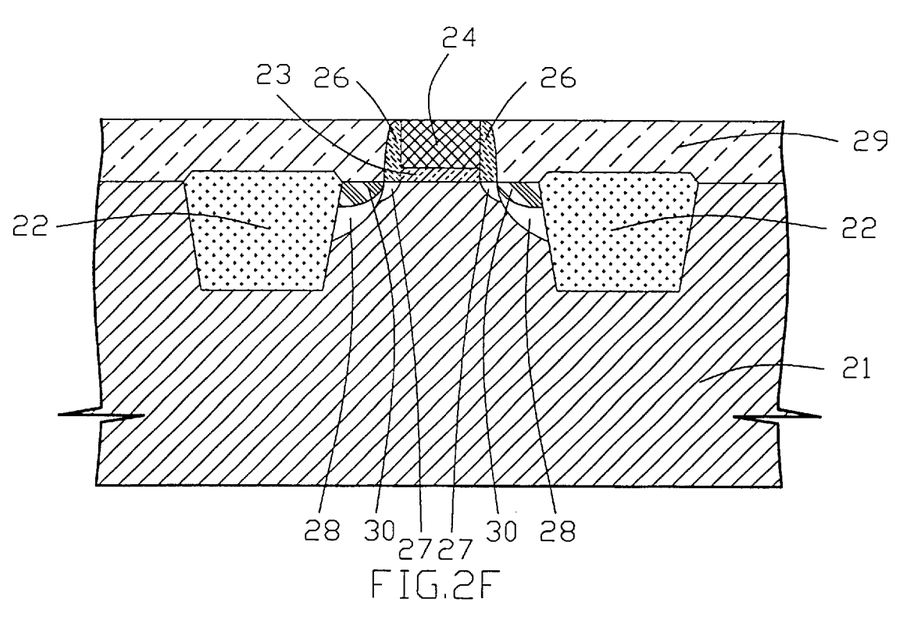

Then, as FIG. 2E, poly-metal dielectric (PMD) layer 29 is formed over substrate 21 and the gate region. Poly-metal dielectric layer 29 is etched back and barrier layer 25 until the surface of polysilicon layer 24 is exposed as indicated FIG. 2F.

Figure 2G:
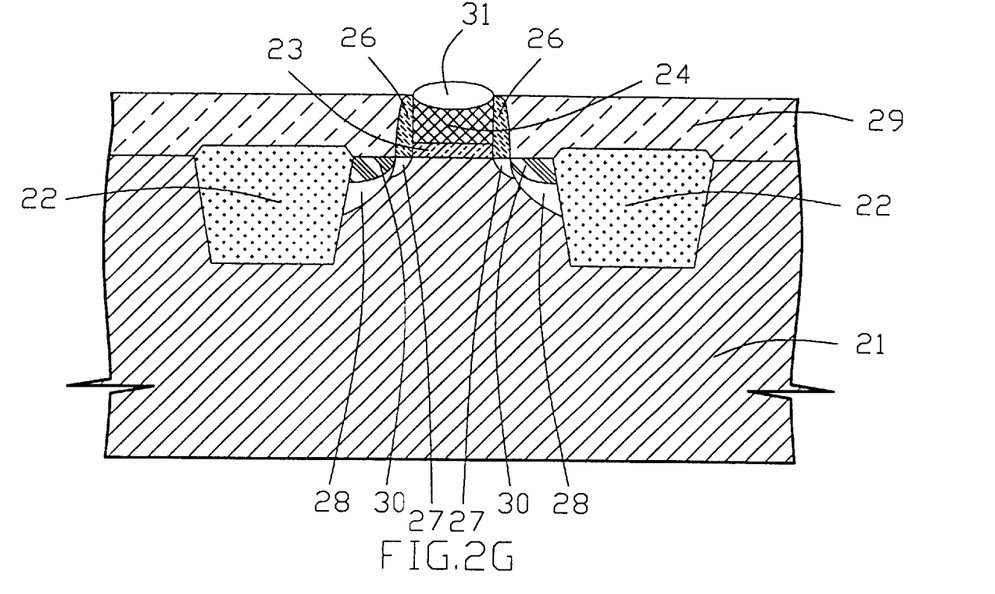

Finally, as FIG. 2G, second silicide region 31 is formed on and in polysilicon layer 24 by thermally reacting second metal and polysilicon layer 24. The above second metal is metal titanium. Also, the thickness of this second silicide regions 30 is mostly preferred 400 to 1000 angstroms. The source and the drain regions are prevented from further reacting by the protection of the poly-metal dielectric layer 29.

Especially, while forming a well region between the isolation regions before forming the gate oxide layer, the well region has a conductivity type opposite to the conductivity type of the first ions and the second ions.

The advantages according to the preferred embodiment will be described as the following:
1. There is no source/drain and polysilicon gate bridging due to the wider production window exists.
2. Sheet resistance of polysilicon gate can be suppressed completely.
3. Sheet resistance of source/drain can be optimized for the sub-0.25 um flow in new generation.
4. Titanium silicide process can be used under sub-0.25 um semiconductor device in new generation.

Therefore, it can be briefly described the preferred embodiment of the present invention. Firstly, two trench isolation regions are formed in a semiconductor substrate. The isolation regions are separated from each other by an active region. A gate oxide layer is formed on the substrate. A polysilicon layer is formed on the gate oxide layer. A barrier layer is formed on the polysilicon layer. Patterning is carried out to etch portions of the barrier layer. Then the polysilicon layer and the gate oxide layer until the substrate is exposed, thereby forming a gate region substantially located in the midway between the trench isolation regions. The areas between the trench isolation regions and the gate region are respectively used as a source area and a drain area. First ions are implanted into the substrate using the gate region and the trench isolation regions as an implant mask. A dielectric layer is blanket formed over the gate region and the substrate. The dielectric layer is etched back to form dielectric spacer on sidewalls of the gate region. The second ions are implanted into the substrate using the gate region. The dielectric spacer and the trench isolation regions are used as an implant mask. The conductivity type of the first ions are the same as conductivity type of the second ions, and the concentration of the second ions are greater than the concentration of the first ions. The first silicide regions respectively are formed in the source area and the drain area by thermally reacting first metal and the substrate in the source and the drain area. The gate region is prevented from being reacted with the first metal by the protection of the barrier layer and the dielectric spacer. A poly-metal dielectric (PMD) layer is formed over the substrate and the gate region. The poly-metal dielectric layer is etched back and the barrier layer until the surface of the polysilicon layer is exposed. The second silicide region is formed on and in the polysilicon layer by thermally reacting second metal and the polysilicon layer. The source and the drain regions are prevented from further reacting by the protection of the poly-metal dielectric layer.

Although specific embodiments have been illustrated and described, it will be obvious to those skilled in the art that various modifications may be made without departing from what is intended to be limited solely by the appended claims.

What is claimed is:

1. A two-step silicidation process for fabricating a semiconductor device, said process comprising:

forming two trench isolation regions in a semiconductor substrate, said isolation regions being separated from each other by an active region,forming a gate oxide layer on the substrate, forming a polysilicon layer on said gate oxide layer, forming a barrier layer on said polysilicon layer, patterning to etch portions of said barrier layer, said polysilicon layer and said gate oxide layer until the substrate is exposed, thereby forming a gate region substantially located in the midway between a trench isolation regions, wherein areas between said trench isolation regions and the gate region are respectively used as a source area and a drain area;

implanting first ions into the substrate using the gate region and the trench isolation regions as an implant mask;

blanket forming a dielectric layer over the gate region and the substrate;

etching back said dielectric layer to form dielectric spacer on sidewalls of the gate region;

implanting second ions into the substrate using the gate region, the dielectric spacer and the trench isolation regions as an implant mask, wherein conductivity type of said first ions is the same as conductivity type of said second ions, and the concentration of said second ions is greater than the concentration of said first ions;

forming first silicide regions respectively in the source area and the drain area by thermally reacting a first metal and the substrate in the source and the drain area, wherein the gate region is prevented from being reacted with the first metal by the protection of said barrier layer and the dielectric spacer;

forming a poly-metal dielectric (PMD) layer over the substrate and the gate region;

etching back said poly-metal dielectric layer and said barrier layer until the surface of the polysilicon layer is exposed; and forming a second silicide region on and in the polysilicon layer by thermally reacting a second metal and the polysilicon layer, wherein the source and the drain regions are prevented from further reacting by the protection of the poly-metal dielectric layer.

2. The process according to claim 1, wherein said barrier layer comprises silicon oxide.

3. The process according to claim 1, wherein said dielectric layer comprises silicon oxide.

4. The process according to claim 1, wherein said barrier layer has a thickness of about 100–700 angstroms.

5. The process according to claim 1, wherein said first metal and said second metal comprises metal titanium.

6. The process according to claim 1, wherein thickness of said first silicide regions is about 200–600 angstroms.

7. The process according to claim 6, wherein thickness of said second silicide region is about 400–1000 angstroms.

8. The process according to claim 1, further comprising forming a well region between said isolation regions before forming said gate oxide layer, wherein said well region has a conductivity type opposite to the conductivity type of said first ions and said second ions.

9. The process according to claim 1, wherein said process is utilized under a sub-0.25 um flow.

* * * * *